FLEXIBLE ELECTRONIC COMPONENT HOLDER

Filed Dec. 7, 1962

INVENTOR.
FRANCIS D. MELIA
BY
Fryer & Tjensvold
ATTORNEYS 3,239,793

FLEXIBLE ELECTRONIC COMPONENT HOLDER

Francis D. Melia, 490 Broadway, San Francisco, Calif.

Filed Dec. 7, 1962, Ser. No. 243,005
3 Claims. (Cl. 339—59)

The present invention relates to electronic components and more particularly to solderless means for electrically disposing an electronic component into a circuit.

The standard, well known practice for electrically disposing an electronic component into a circuit includes soldering the component lead wires to a circuit terminal or other juncture point. While this method of electrically placing a component into a circuit has the advantage of insuring good solid electrical contact, it has a number of disadvantages, especially under certain circumstances. These disadvantages include the necessity of unsoldering one or more of the component lead wires when checking a component during circuit repair. Another disadvantage of soldering a component into a circuit occurs when heat-sensitive components are being employed. Such components include certain types of diodes, high-precision resistors and components which form a matched pair. When such components are soldered into a circuit it is not uncommon for the heat which is generated during the soldering operation to affect the values of the components being put in place.

The present invention provides a solderless means by which a component can be electrically disposed in a circuit such that the aforementioned disadvantages are overcome while a number of distinct advantages are enjoyed.

Accordingly, it is an object of the present invention to provide means by which electronic components can be electrically disposed in an electrical circuit without requiring soldering or other application of heat.

It is another object of the present invention to provide a holder for electronic components wherein the holder provides a protective means for the component while at the same time enabling the component to be electrically disposed within a circuit.

Further and more specific objects and advantages of the invention are made apparent in the following specification wherein a preferred form of the invention is described by reference to the accompanying drawings.

Figures 1, 2, 3, 4, 5:
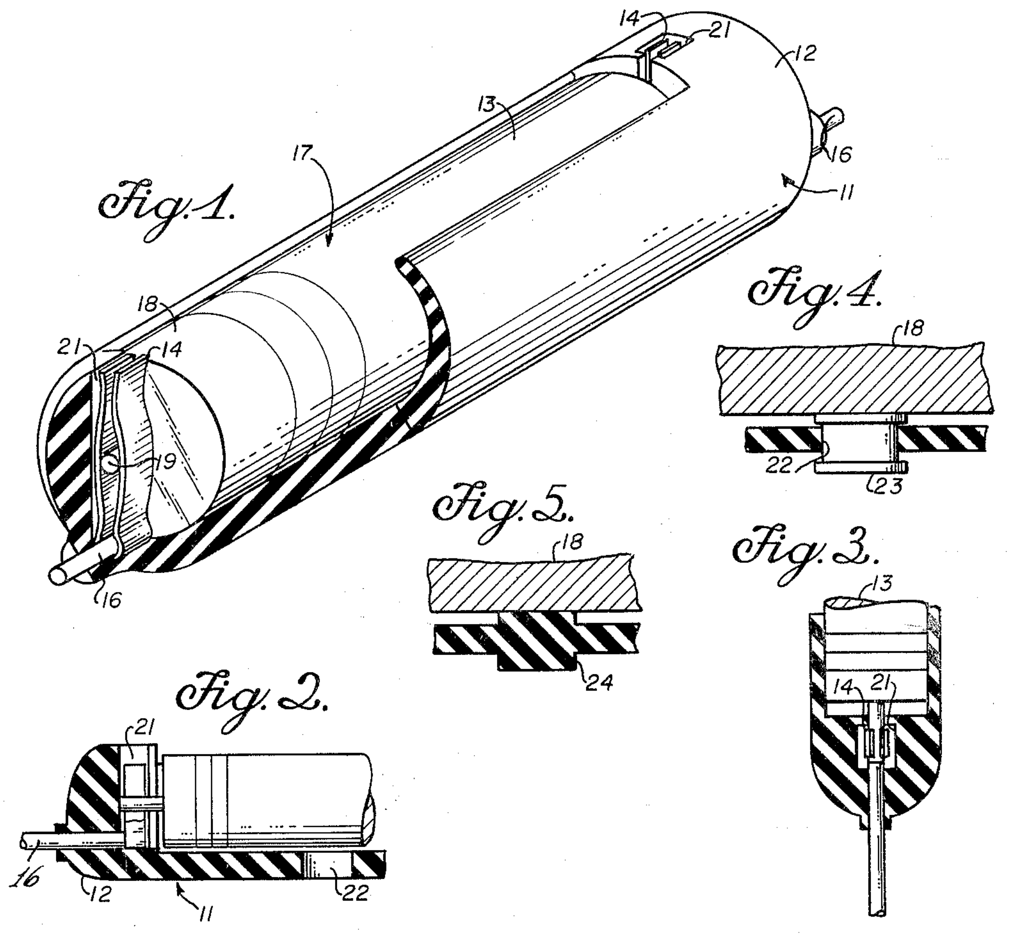
FIG. 1 is an isometric view of the component holder of the present invention with certain portions cut away to more clearly illustrate details thereof.
FIG. 2 is a side elevation of a portion of the holder of FIG. 1 shown in cross-section.
FIG. 3 is a plan view of the portion of the holder shown in FIG. 2.
FIGS. 4 and 5 illustrate alternate means to aid in component removal from the holder of FIG. 1.

Referring now to FIG. 1, a component holder 11 includes a body member 12 formed from a resilient material such as rubber or soft plastic and having an opening 13 for receiving a component, a pair of clips 14 disposed at either end of the opening of body member 12, and a pair of lead wires 16 electrically connected to and extending from clips 14. A component 17 having a generally cylindrical body portion 18 and a pair of lead wires 19 (only one of which is illustrated) is operatively disposed within the holder 11 to illustrate the manner in which the holder functions. Component 18 is typical of a number of different kinds of components such as resistors, capacitors or other two terminal devices of similar shape. Thus, the invention is not restricted to any particular component or even to components of two terminals as will be shown in detail below.

Referring to FIGS. 2 and 3 along with FIG. 1, opening 13 terminates at each end in a very narrow opening 21 which extends diametrically into the holder 11. Disposed within each of the openings 21 is a metallic clip 14 which is designed to receive the terminals 19 of the component to be held by the body portion 12 of holder 11 and form an electrical connection therewith. The particular configuration of clip 14 is for the most part a matter of choice and may be advantageously selected to suit the particular type of component with which the holder is to be used. The particular clips 14 illustrated in the present invention are simple one-piece members formed in the shape of a U with the open end disposed to receive the lead wires of the component 17. These clips need not be formed integrally with the body portion 12 but may be separate therefrom and secured into place in opening 21. By forming opening 21 of the proper size clips 14 will be firmly secured in place and the opposing sides thereof will be urged toward one another such that when the lead wires 19 are forced in between the opposing sides of the clip sufficient pressure will be applied to the component lead wire to insure a good electrical connection betwen the lead wire and the clip. Ssecured to the bottom portion of the clip in any appropriate manner is a lead wire 16 which extends out from the body portion 12 of the component holder and provides means by which the component holder can be electrically connected to a desired terminal or juncture point in a circuit.

Thus, in operation a component holder 11 is secured into a circuit between a desired pair of terminal points by soldering lead wires 16 to each of such points. The component which is to be electrically disposed between these terminal points is then inserted into the component holder by placing it into the opening 13 such that its lead wires 19 pass into the opening of the clips 14. In this manner the component has been electrically disposed in the desired position without the necessity of applying heat directly to the component or its lead wires and without having the component so secured within the circuit as to require the application of heat to its terminal wires to remove it therefrom.

As best shown in FIGS. 1 and 3, openings 13 can be formed to have a width which is less than the diameter of the component to be placed into the holder such that it is necessary that the body of the component be resilient enough to spread apart when the component is placed therein. Once the component is in place, however, the resilient body portion will assume its previous shape and thereby firmly hold the component in place such that the clips 14 are not the only forces tending to maintain the component in the desired position. By so enveloping the component the body portion 11 also acts as a protective device so as to reduce the possibility of damage to components due to shock or other potentially damaging forces. The component holder body 12 does not so envelop the component, however, as to obscure the markings which may be disposed thereon for purposes of identifying the type or value of the component contained in the holder. It should be noted that the body portion 12 not only envelops the component but also completely envelops the clips 14 so as to protect against short-circuiting of components by accidental contact of lead wires.

In FIG. 2, a hole 22 is shown as being formed in the underside of the body portion 12 of the holder 11 approximately midway between the ends thereof. Such a hole makes it very convenient for removing a component from the holder by merely pushing an implement into the hole and applying pressure to the underside of the component therewith. FIGS. 4 and 5 illustrate alternative means by which a component can be removed from the holder. FIG. 4 illustrates a plug 23 slidably disposed within the hole 22 such that by sliding the plug 23 towards the component holder pressure is applied against the component urging it out of the holder. This particular means for removing the component has an advantage over merely providing a hole through which an implement can be inserted, in that damage to the component is, for all practical purposes, precluded due to the relatively large surface area of the plug 23 which contacts the component. FIG. 5 illustrates an alternative embodiment of the plug of FIG. 4 wherein the plug 24 is an integral portion of the body member 12 which operates most advantageously when the component holder is of a flexible type material.

The ease with which a component can be inserted or withdrawn from the holder 11 makes the present invention not only advantageous for purposes of checking components when repairing an electronic device or for preventing damage to the components due to heat when inserting them into the circuit but also provides a convenient device to be used in development work wherein the particular value of a component or the particular type of component to be used is most advantageously determined by trial and error methods. Using the present invention, it is a simple matter to insert and withdraw a number of components until the proper one is found. The device also is highly advantageous in a circuit which has components that can be interchanged for purposes of changing the characteristics of the circuit to meet varying contingencies. Once again the present invention provides means by which the component could be readily exchanged for a component of a different value without requiring the necessity of soldering and unsoldering.

Figure 6:
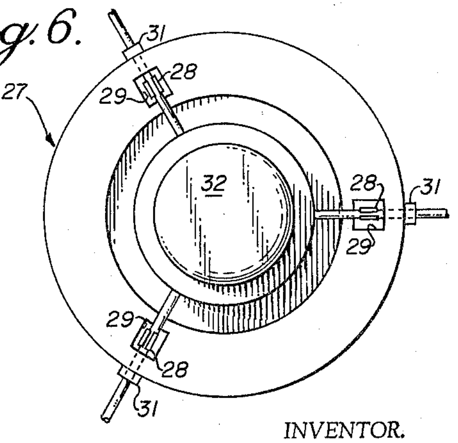
FIG. 6 is a plan view of a component holder for a three terminal component.
Figure 7:
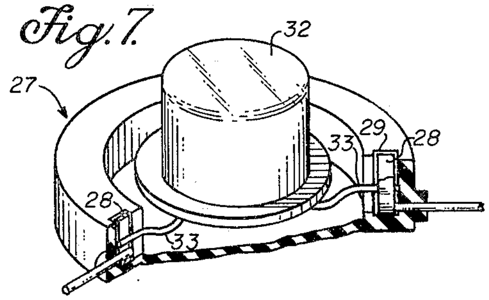
FIG. 7 is an isometric view of the holder of FIG. 6 with certain portions broken away to more clearly reveal various details thereof.

Referring now to FIGS. 6 and 7 an annular shaped holder 27 is formed from a resilient material and has three metallic clip members 28 disposed therein at different locations around its circumference. Clips 28 are disposed in axial grooves 29 and are similar to the clips 14 of the holder of FIG. 1. Clips 28 are electrically connected to lead wires 31 which extend out of and away from the holder 27 such that the holder can be electrically connected into a circuit. A three-terminal transistor 32 is shown electrically disposed in holder 27 by having its lead wires 33 inserted into clips 28. Thus, the embodiment of the invention as illustrated in FIGS. 6 and 7 has the advantages of the two-terminal holder but assumes a different form so as to enable a plurality of lead wires to be conveniently received. The transistor is seen to be securely held in place and electrically connected into the holder. By soldering the lead wires of the holder into the circuit before inserting the transistor into the holder the transistor can be electrically disposed into a desired circuit without the necessity of applying heat to its terminals and thus precluding the chance of damage to the transistor through such heat application. The manner in which components having more than three lead wires could be accommodated in a holder is a logical extension of the teachings herein.

I claim:

1. A holder for an electronic component wherein the component is of the type which is designed to be soldered into a circuit and thus includes lead wires designed to be soldered to circuit terminals, comprising in combination;

a generally hollow holder body of non-conductive, flexible material, said body having an opening therein for receiving a component wherein the opening approximates the shape of the component, said body opening having one dimension which is approximately equal to the dimension of the component between its lead wires and another dimension which is smaller than another corresponding dimension of the component whereby it is necessary to enlarge the opening in a direction other than that between lead wires to admit a component to said holder body;

a plurality of electrically conductive clips disposed in said holder body to receive component lead wires; and lead wires electrically joined to each of said clips.

2. The holder of claim 1 wherein the component is of generally cylindrical shape with a lead wire at either end and the body opening is generally rectangular in shape with its length at least as long as the component and its width smaller than the diameter of the component.

3. A component holder and component comprising in combination;

a generally cylindrical electrical component having lead wires extending from the opposing ends of the component, said component being of the type designed to be soldered into a circuit and thus having lead wires designed for soldering to terminals, wherein the lead wires are cut from their original length to a length no longer than one inch;

a component holder having a generally hollow body portion of electrically non-conductive, resilient material, said holder having an opening therein which is at least as long as said component and narrower than the diameter of said component, said opening having narrow extending portions at the ends thereof;

an electrically conductive clip disposed in each of the extending portions of said body opening whereby said component is held in said body portion, after extending the width of the opening thereof, by both said clips and said body portion; and terminal lead wires connected to said clips.

References Cited by the Examiner

UNITED STATES PATENTS

| | | | |
|---|---|---|---|
| 1,498,500 | 6/1924 | Wilhelm et al. | 339—156 |
| 2,240,331 | 4/1941 | Geiger et al. | 339—52 |
| 2,443,706 | 6/1948 | Jansen | 339—192 |
| 2,662,953 | 12/1953 | Barker | 339—61 |
| 3,048,810 | 8/1962 | Steen | 339—75 |

FOREIGN PATENTS

| | | |
|---|---|---|
| 652,246 | 10/1928 | France. |

JOSEPH D. SEERS, *Primary Examiner.*